(12) United States Patent
Jiang et al.

(10) Patent No.: US 8,164,346 B2
(45) Date of Patent: *Apr. 24, 2012

(54) ORIENTATION DETECTION CIRCUIT AND ELECTRONIC DEVICE USING THE SAME

(75) Inventors: Wan-Jun Jiang, Shenzhen (CN); Ting Dong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 386 days.

This patent is subject to a terminal disclaimer.

(21) Appl. No.: 12/546,629

(22) Filed: Aug. 24, 2009

(65) Prior Publication Data

US 2010/0148807 A1    Jun. 17, 2010

(30) Foreign Application Priority Data

Dec. 16, 2008    (CN) .......................... 2008 1 0306293

(51) Int. Cl.
*G01R 31/02* (2006.01)

(52) U.S. Cl. ....................................................... 324/537
(58) Field of Classification Search ........................ None
See application file for complete search history.

(56) References Cited

U.S. PATENT DOCUMENTS

| 7,999,789 B2 * | 8/2011 | Ha et al. ........................ 345/156 |
| 2003/0055597 A1 * | 3/2003 | Berndorfer ................... 702/150 |
| 2008/0228432 A1 * | 9/2008 | Ha et al. ........................ 702/150 |
| 2010/0148852 A1 * | 6/2010 | Jiang et al. ................... 327/516 |

* cited by examiner

*Primary Examiner* — Jermele M Hollington
(74) *Attorney, Agent, or Firm* — Altis Law Group, Inc.

(57) ABSTRACT

An orientation detection circuit is provided. The circuit includes a processor, a first resistor, a second resistor, a third resistor, and a vibration switch. The processor comprises a first input pin and a second input pin. The second resistor has a resistance value greater than that of the first resistor. The third resistor has a resistance value greater than that to the second resistor. The switch comprises a first terminal connected to a power source and a second terminal connected to the second input pin and connected to ground via the third resistor. The switch includes a third terminal connected to the first terminal via the second resistor, and a fourth terminal connected to the first input pin and connected to ground via the first resistor. The switch also includes a fifth terminal connected to the fourth terminal, and a conductive ball for contacting two or three of the terminals.

13 Claims, 7 Drawing Sheets

| Pin IO1 | Pin IO2 | Control signal |
|---|---|---|
| Low level | Low level | S1 |
| Low level | High level | S2 |
| High level | Low level | S3 |
| High level | High level | S4 |

FIG. 6

ORIENTATION DETECTION CIRCUIT AND ELECTRONIC DEVICE USING THE SAME

BACKGROUND

1. Technical Field

The present disclosure relates to orientation detection circuits and, more particularly, to an orientation detection circuit capable of detecting four placement orientations of devices utilizing the circuit.

2. Description of Related Art

FIG. 7 shows an orientation detection circuit 10. The circuit 10 includes a vibration switch K1, a processor U1, a first resistor R1, and a second resistor R2. The vibration switch K1 includes a first terminal 11, a second terminal 12, a third terminal 13, a fourth terminal 14, and a metal ball 15. The processor U1 includes a first input pin IO1 and a second input pin IO2.

The terminal 11 is connected to the pin IO1 and connected via the resistor R1 to a power source. The terminal 12 is connected to the pin IO2 and connected via the resistor R2 to the power source. The terminals 13 and 14 are grounded. When the ball 15 contacts two of the four terminals 11, 12, 13, and 14, the processor U1 can obtain input states of "11", "10", and "01", which corresponds to three different orientations of the switch K1. In other words, the circuit 10 can be used to detect three placement orientations of a device that utilizes the circuit 10.

However, in some circumstances, devices can be placed in any of four orientations and it may be desirable to be able to detect the four orientations.

BRIEF DESCRIPTION OF THE DRAWINGS

The components in the drawings are not necessarily drawn to scale, the emphasis instead being placed upon clearly illustrating the principles of the orientation detection circuit. Moreover, in the drawings, like reference numerals designate corresponding parts throughout the several views.

FIG. 6 shows an exemplary relation table stored in the orientation detection circuit of FIG. 1.

DETAILED DESCRIPTION

Figure 1:
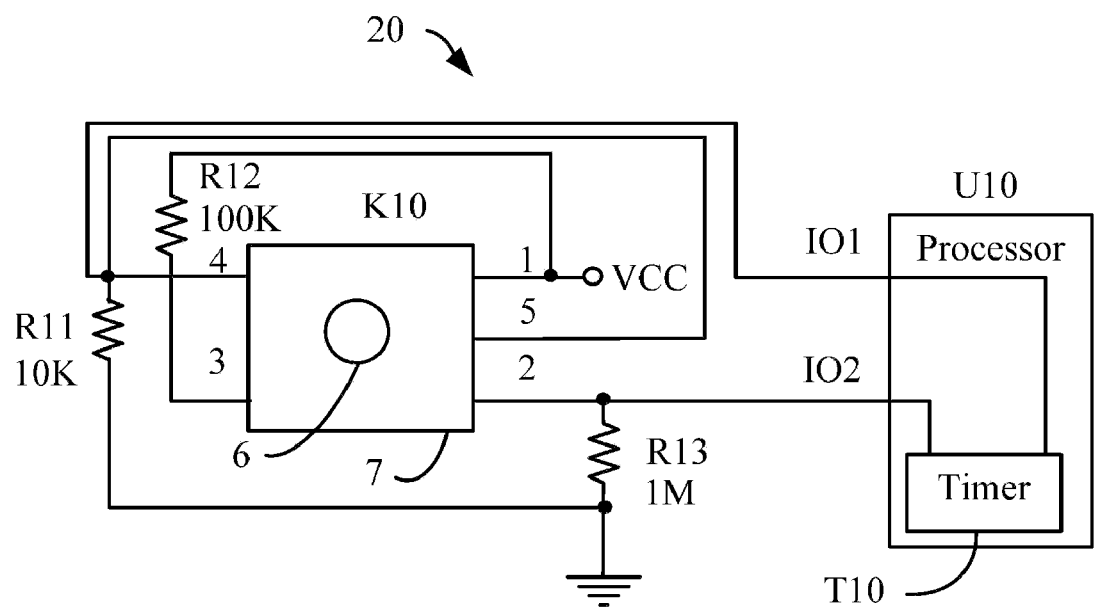
FIG. 1 is a circuit diagram of an orientation detection circuit in accordance with an exemplary embodiment.

FIG. 1 shows a circuit diagram of an orientation detection circuit 20 in accordance with an exemplary embodiment. The circuit 20 includes a vibration switch K10, a processor U10, a first resistor R11, a second resistor R12, and a third resistor R13.

The processor U10 includes a first input pin IO1 and a second input pin IO2. The resistor R12 has a resistance value that is much greater than that of the resistor R11, while the resistor R13 has a resistance value that is much greater than that of the resistor R12. For example, the resistance value of the resistors R11 and R12 may be 10 k and 100 k ohms, respectively, and the resistance value of the resistor R13 may be 1M ohms.

The vibration switch K10 includes a first terminal 1, a second terminal 2, a third terminal 3, a fourth terminal 4, a fifth terminal 5, and a conductive ball 6. In the exemplary embodiment, the vibration switch K10 includes a rectangular housing 7. The conductive ball 6 is received and can move within the housing 7. The four terminals 1, 2, 3, and 4 are placed adjacent to four parallel inner ridgelines of the housing 7. The terminal 5 is placed between the terminals 1 and 2 and is configured such that the conductive ball 6 can contact the terminals 1, 2, and 5 at the same time.

The first terminal 1 is connected to a power source Vcc. The second terminal 2 is connected to the second pin IO2 and is connected to ground via the third resistor R13. The third terminal 3 is connected to the first terminal 1 via the second resistor R12. The fourth terminal 4 is connected to the first input pin IO1 and is connected to ground via the first resistor R11. The fifth terminal 5 is connected to the fourth terminal 4.

Figure 2:
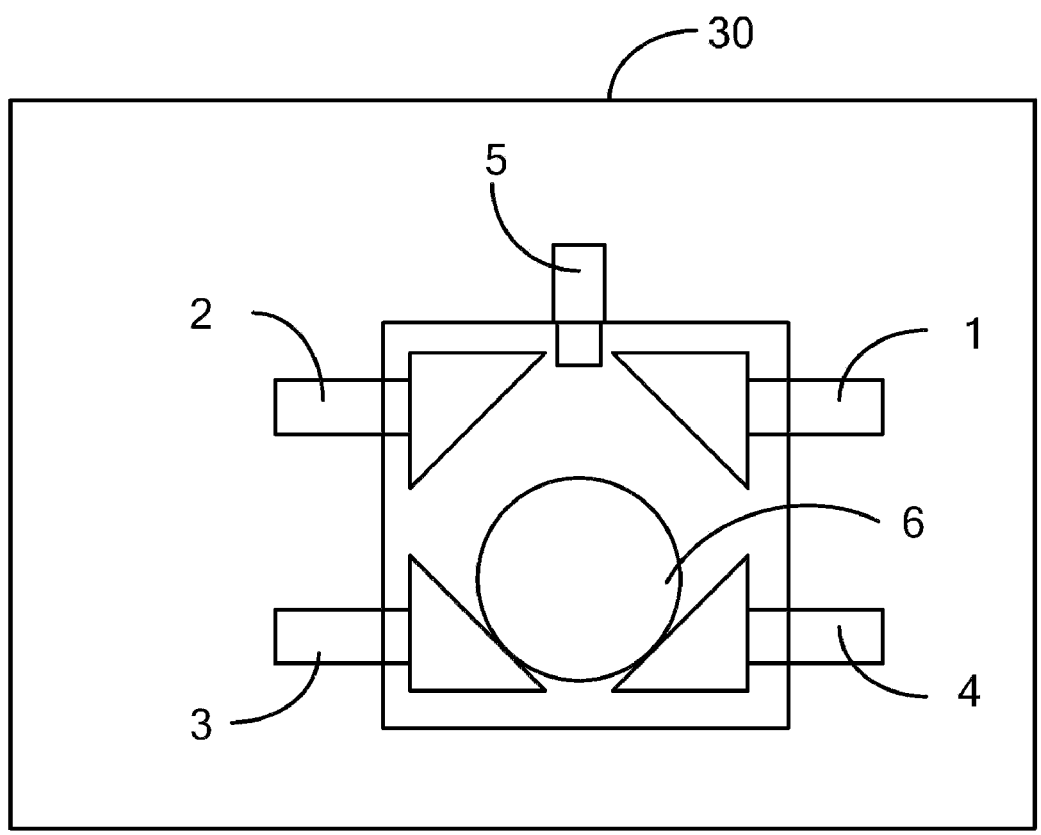
FIG. 2 illustrates an electronic device utilizing the orientation detection circuit of FIG. 1, which is placed in a first orientation.

Referring to FIGS. 2 to 5, in one embodiment, the circuit 20 is used in a digital photo frame 30. As shown in FIG. 2, the digital photo frame 30 is placed at a first orientation (normal orientation). In this circumstance, the conductive ball 6 contacts the terminals 3 and 4. The resistors R11 and R12 are thus connected in series between the power source Vcc and ground, and the pin IO2 is thus connected to ground via the resistor R13. The pin IO2 is thus at low level.

As shown in FIG. 2, the voltage value of the terminal 4 is (R11/(R12+R11))*Vcc. Because the resistance value of the resistor R12 is much greater than that of the resistor R11, the voltage value of the terminal 4 is close to zero. The pin IO1 connected to the terminal 4 is thus at low level. Therefore, when the digital photo frame 30 is placed in the first orientation, the pins IO1 and IO2 are both at low level.

Figure 3:
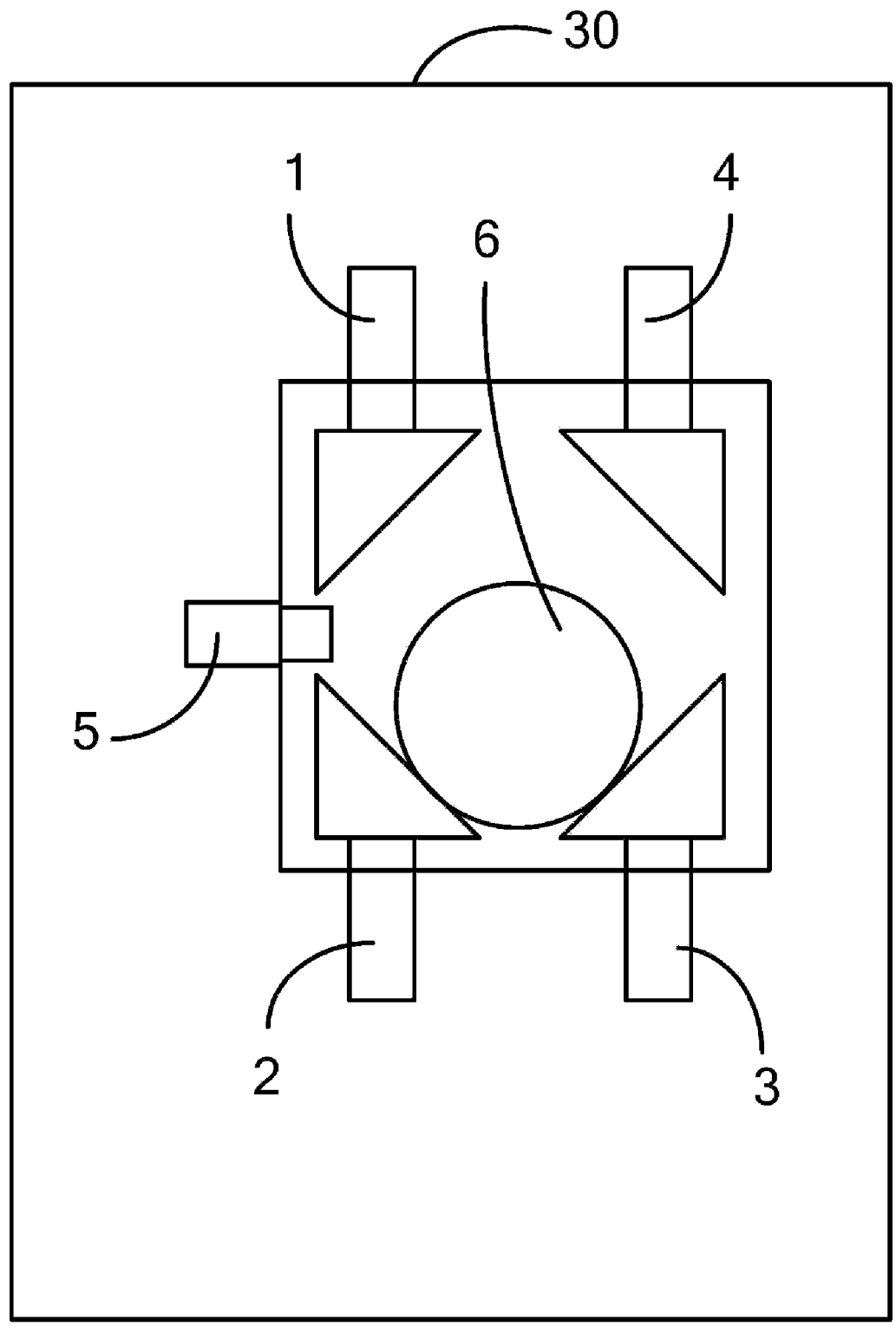
FIG. 3 illustrates the electronic device of FIG. 2 that is placed in a second orientation.

As shown in FIG. 3, the digital photo frame 30 is placed in a second orientation. The conductive ball 6 contacts the terminals 2 and 3. In this circumstance, the resistors R12 and R13 are connected in series between the power source Vcc and ground, and the pin IO1 is connected to ground via the resistor R11. The pin IO1 is thus at low level and the voltage value of the pin IO2 is (R13/(R13+R12))*Vcc. Because the resistance value of the resistor R13 is much greater than that of the resistor R12, the voltage value of the pin IO2 is close to the power source Vcc. Therefore, when the digital photo frame 30 is placed in the second orientation, the pins IO1 and IO2 are at low level and high level, respectively.

Figure 4:
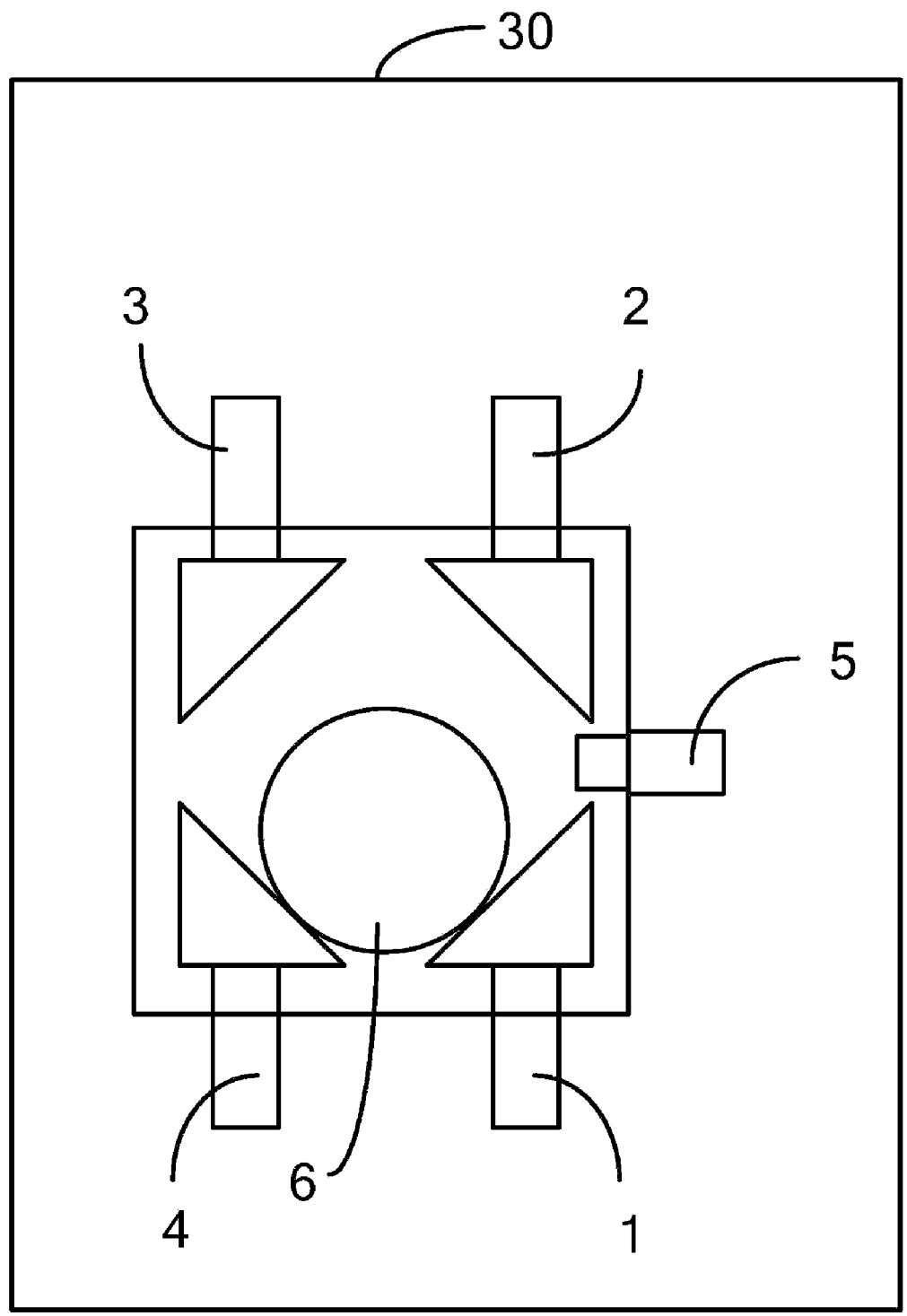
FIG. 4 illustrates the electronic device of FIG. 2 that is placed in a third orientation.

As shown in FIG. 4, the digital photo frame 30 is placed in a third orientation. The conductive ball 6 contacts the terminals 1 and 4. The pin IO1 connected to the terminals 4 is thus at high level, while the pin IO2 is connected to ground via the resistor R13. Therefore, when the digital photo frame 30 is placed in the third orientation, the pins IO1 and IO2 are at high level and low level.

Figure 5:
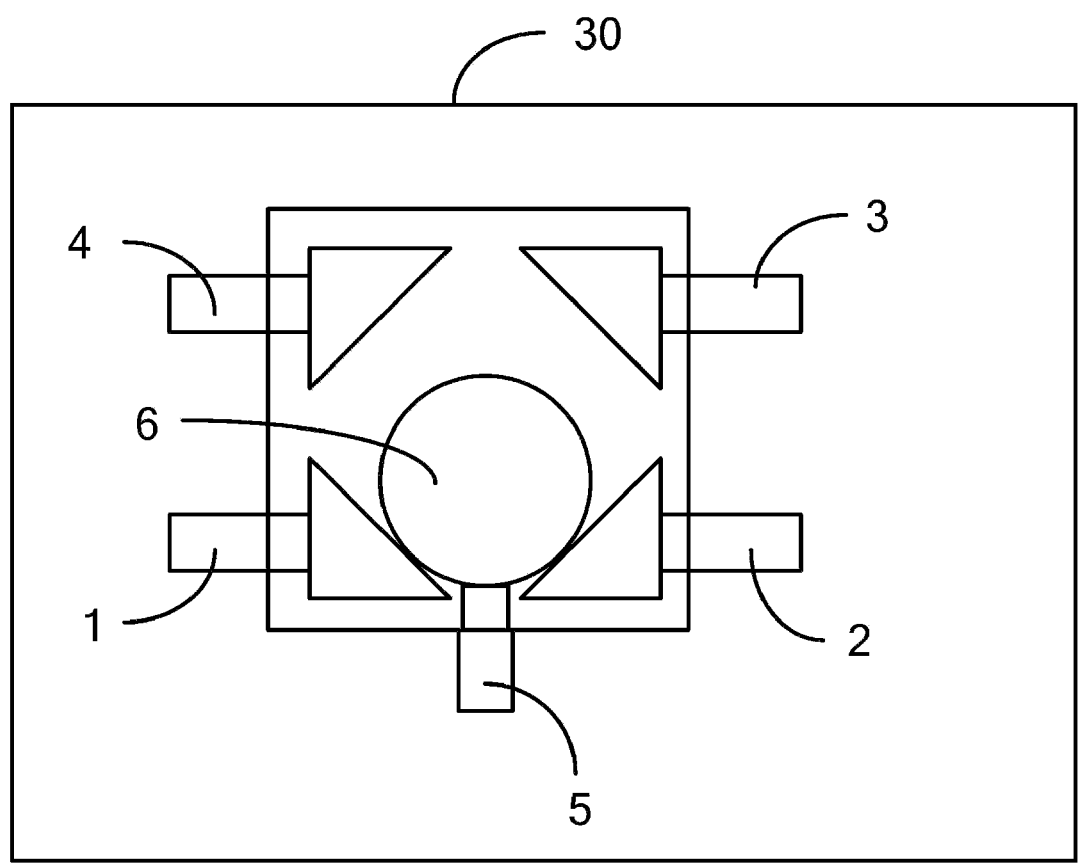
FIG. 5 illustrates the electronic device of FIG. 2 that is placed in a fourth orientation.
Figure 7:
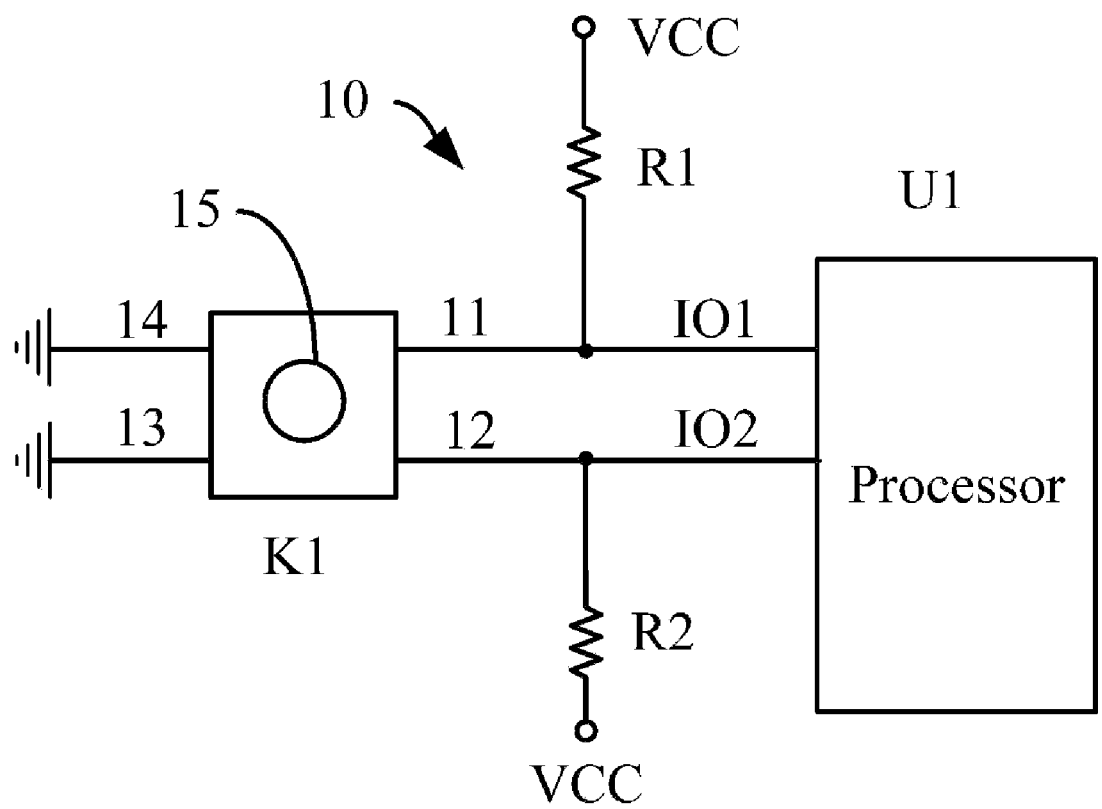
FIG. 7 shows an orientation detection circuit in related art.

As shown in FIG. 5, the digital photo frame 30 is placed in a fourth orientation. The conductive ball 6 contacts the terminals 1, 2, and 5. The pin IO1 connected to the terminal 4 is thus at high level, while the pin IO2 connected to terminal 2 is at high level. Therefore, when the digital photo frame 30 is placed in the fourth orientation, the pins IO1 and IO2 are both at high level.

FIG. 6 shows a relationship table stored in the processor U10 that holds definitions of relationships between the output signal of the processor U10 and the input signals of the pins IO1 and IO2. For example, when the input signals of the pins IO1 and IO2 are at high level and low level, respectively, the processor U10 outputs control signal S1. In the exemplary embodiment, the processor U10 includes a timer T10 for counting the duration period of the input signals. After the duration period of the input signals reaches a preset value, the processor U10 outputs corresponding controls signal.

In the example of using the orientation detection circuit 20 in the digital photo frame 30, the digital photo frame 30 includes a main processing unit (not shown) which executes an operation corresponding to the control signal from the processor U10. For example, the control signal outputted by the processor U10 can be used to keep images displayed on the screen (not shown) of the digital photo frame 30 to be upright. Specifically, the digital photo frame 30 is normally placed in the first orientation and the image displayed on the screen is upright. When the digital photo frame 30 is placed in another orientation, for example, in the third orientation, the image is then rotated 180 degrees based on the control signal, which indicates the digital photo frame 30 is placed in the third orientation, thereby maintaining the image to be upright to users.

While one embodiment has been described and illustrated, the disclosure is not to be constructed as being limited thereto. Various modifications can be made to the embodiments by those skilled in the art without departing from the true spirit and scope of the disclosure as defined by the appended claims.

What is claimed is:

1. An orientation detection circuit comprising:
  a processor comprising a first input pin and a second input pin;
  a first resistor;
  a second resistor having a resistance value greater than that of the first resistor;
  a third resistor having a resistance value greater than that of the second resistor;
  a vibration switch comprising:
    a first terminal connected to a power source;
    a second terminal connected to the second input pin and connected to ground via the third resistor;
    a third terminal connected to the first terminal via the second resistor;
    a fourth terminal connected to the first input pin and connected to ground via the first resistor;
    a fifth terminal connected to the fourth terminal; and
    a conductive ball configured for simultaneously contacting two or three of the terminals of the vibration switch;
  wherein, the processor is configured for identifying signals from the first input pin and the second input pin, and outputting a corresponding control signal.

2. The orientation detection circuit according to claim 1, wherein the first resistor has a resistance value of 10 k ohms, the resistance values of the second and third resistors are 100 k ohms and 1 M ohms, respectively.

3. The orientation detection circuit according to claim 1, wherein the processor comprises a timer for counting a duration period of the signals of the first input pin and the second input pin, and the processer outputs the control signal after the duration period reaches a preset value.

4. The orientation detection circuit according to claim 1, wherein the fifth terminal is placed between the first and second terminals and is configured such that the conductive ball can contact the first, second, and fifth terminals, simultaneously.

5. The orientation detection circuit according to claim 1, wherein the vibration switch includes a housing, the conductive ball is placed within the housing.

6. The orientation detection circuit according to claim 5, wherein the housing is in a rectangular shape and the first, second, third, and fourth terminals are placed adjacent to four parallel inner ridgelines of the housing.

7. An electronic device comprising:
  a main processing unit; and
  an orientation detection circuit comprising:
    a processor comprising a first input pin and a second input pin;
    a first resistor;
    a second resistor having a resistance value greater than that of the first resistor;
    a third resistor having a resistance value greater than that of the second resistor;
    a vibration switch comprising:
      a first terminal connected to a power source;
      a second terminal connected to the second input pin and connected to ground via the third resistor;
      a third terminal connected to the first terminal via the second resistor;
      a fourth terminal connected to the first input pin and connected to ground via the first resistor;
      a fifth terminal connected to the fourth terminal; and
      a conductive ball configured for simultaneously contacting two or three of the terminals of the vibration switch;
    wherein, the processor is configured for identifying signals from the first input pin and the second input pin, and outputting a corresponding control signal;
  wherein, the main processing unit is configured for executing operations according to the control signals from the orientation detection circuit.

8. The electronic device according to claim 7, wherein the first resistor has a resistance value of 10 k ohms, the resistance value of the second and third resistors are 100 k ohms and 1 M ohms, respectively.

9. The electronic device circuit according to claim 7, wherein the processor comprises a timer for counting a duration period of the signals of the first input pin and the second input pin, and the processer outputs the control signal after the duration period reaches a preset value.

10. The electronic device according to claim 7, wherein the fifth terminal is placed between the first and second terminals and is configured such that the conductive ball can contact the first, second, and fifth terminals, simultaneously.

11. The electronic device according to claim 1, wherein the vibration switch includes a housing, the conductive ball is placed within the housing.

12. The electronic device according to claim 11, wherein the housing is in a rectangular shape and the first, second, third, and fourth terminals are placed adjacent to four parallel inner ridgelines of the housing.

13. The electronic device according to claim 7, wherein the electronic device is a digital photo frame.

* * * * *